(12) United States Patent
Scheibe et al.

(10) Patent No.: US 8,911,868 B2
(45) Date of Patent: Dec. 16, 2014

(54) COATING BASED ON DIAMOND-LIKE CARBON

(75) Inventors: Hans-Joachim Scheibe, Dresden (DE);
Thomas Schuelke, Brighton, MI (US);
Lars Haubold, East Lansing, MI (US);
Michael Becker, East Lansing, MI (US);
Yaran Mahmut, East Lansing, MI (US)

(73) Assignees: Fraunhofer-Gesellschaft zur Foerderung der Angewandten Forschung E.V., Munich (DE);
Fraunhofer USA, Inc., Plymouth, MI (US)

( * ) Notice: Subject to any disclaimer, the term of this patent is extended or adjusted under 35 U.S.C. 154(b) by 187 days.

(21) Appl. No.: 13/548,550

(22) Filed: Jul. 13, 2012

(65) Prior Publication Data
US 2013/0045367 A1 Feb. 21, 2013

Related U.S. Application Data

(60) Provisional application No. 61/573,048, filed on Aug. 17, 2011.

(51) Int. Cl.
*C23C 14/00* (2006.01)
*C23C 14/06* (2006.01)
*C23C 14/32* (2006.01)

(52) U.S. Cl.
CPC ......... *C23C 14/0021* (2013.01); *C23C 14/0605* (2013.01); *C23C 14/325* (2013.01)
USPC ............................ 428/408; 428/216; 428/336

(58) Field of Classification Search
USPC ...................... 51/307, 309; 428/216, 336, 408
See application file for complete search history.

(56) References Cited

U.S. PATENT DOCUMENTS

| 6,468,642 | B1 * | 10/2002 | Bray et al. | 428/216 |
| 6,652,969 | B1 * | 11/2003 | Murakami et al. | 428/408 |
| 6,840,424 | B2 * | 1/2005 | Sung | 228/4.5 |
| 6,994,474 | B2 * | 2/2006 | Kinno et al. | 384/492 |
| 7,820,293 | B2 * | 10/2010 | Dekempeneer | 428/408 |

FOREIGN PATENT DOCUMENTS

| DE | 102007054181 | * | 5/2009 |
| JP | 2005-330556 | * | 12/2005 |
| WO | 01/40537 | * | 6/2001 |

* cited by examiner

*Primary Examiner* — Archene Turner
(74) *Attorney, Agent, or Firm* — Jacobson Holman Hershkovitz, PLLC

(57) ABSTRACT

A coating based on diamond-like is formed from a plurality of films of diamond-like carbon formed alternatingly over one another and in this respect a film in which no portion or only a much lower portion of doped fluorine is contained. A film in which fluorine or at least fluorine with a higher portion than the film arranged thereunder or thereabove are formed alternatingly over one another. The coating could be manufactured by using a target of pure carbon. Films are deposited on a surface of a substrate by means of a PVD process, with the portion of fluorine contained in doped form. Films are formed alternately being varied by varying a supplied volume flow of a fluorine/carbon compound or sulfur/fluorine compound as a precursor.

10 Claims, 2 Drawing Sheets

COATING BASED ON DIAMOND-LIKE CARBON

Figure 1:
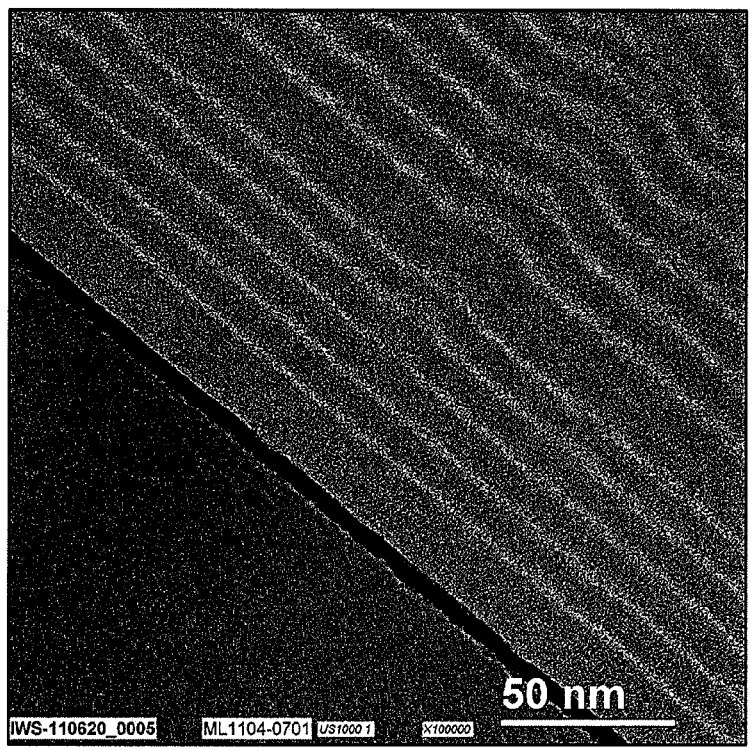

This is a complete application claiming benefit of provisional no. 61/573,048, filed Aug. 17, 2011, hereby incorporated by reference.

The invention relates to coatings based on diamond-like carbon which are formed on different substrates and can be used for different cutting and antifriction applications.

It has thus long been known to provide substrates with a coating of diamond-like carbon. Such coatings have a high hardness and a good antifriction behavior and wear behavior. Correspondingly coated substrates are used for the most varied applications. The properties can be influenced by doping and by the hydrogen content.

It is thus known that the antifriction behavior of such films can be improved by doping with fluorine since this positively influences the surface properties. It is thus described in U.S. Pat. No. 6,468,642 B1 how such films can also be doped with other chemical elements, in particular additionally with Si, O and hydrogen, in addition to fluorine. The film properties can thereby be further modified and influenced.

Suitable precursors on an organic basis in which the chemical elements are contained can be used for the forming of such films. In this respect, however, the process management during the coating is complex and it is difficult to set the desired portions of the chemical elements in the coating.

It has additionally been found that films which are doped solely or additionally with fluorine admittedly show improved antifriction properties with respect to dynamic friction and also static friction, but that these advantageous properties are only maintained over a relatively short time period and the service life is therefore correspondingly shortened due to wear.

It is therefore the object of the invention to provide a coating on substrate surfaces which also has or achieves an increased service life, in addition to a high hardness and a good antifriction behavior, while maintaining these positive properties.

This object is achieved in accordance with the invention by a coating having the features of claim 1. It can be manufactured using a method in accordance with claim 13. Advantageous embodiments and further developments of the invention can be realized using features designated in the subordinate claims.

The coating in accordance with the invention based on diamond-like carbon is formed from a plurality of films of diamond-like carbon formed above one another in an alternating manner. In this respect, a respective film in which no portion of doped fluorine or only a much lower portion of doped fluorine is contained is formed and a film in which fluorine is contained, or at least fluorine with a higher portion than in the film arranged thereunder or thereabove, are arranged alternatingly over one another. The films without fluorine or with less fluorine therefore alternate with films in which fluorine or more fluorine is contained so that a corresponding alternating film system is formed on the surface of a substrate.

In films comprising fluorine or comprising an increased portion of fluorine, fluorine should be contained with a portion in the range 0.5 at % to 5 at %. In these films, the portion of fluorine should advantageously be maintained at 1±0.5 at %. The portion of fluorine in films comprising less fluorine should accordingly be lower than 0.5 at % in any case.

Films comprising fluorine or comprising an increased portion of fluorine should have a smaller film thickness than films in which no portion or only a much lower portion of doped fluorine is contained. The hardness, strength and the useful service life of the coating in accordance with the invention can thereby be further improved and the respective advantageous properties of the pure or almost pure diamond-like carbon together with those of the carbon doped with fluorine can be utilized even better, and above all longer, since the wear can be reduced with respect to the films of diamond-like carbon doped only with fluorine. The surface properties improved by fluorine can nevertheless still be easily utilized.

All individual films should each have a film thickness in the range 1 nm to 100 nm in the coating in accordance with the invention. The total film thickness of the coating then results from the sum of the individual films formed over one another. It can be up to 20 µm. However, considerably smaller total film thicknesses can also be sufficient for specific applications.

For instance, in a coating having at least ten individual films formed over one another, which should represent a minimum number of films, a total film thickness of 0.1 µm should be achieved with an individual film thickness of 10 nm in each case.

It has been found that diamond-like carbon called ta-C in this area of the art is particularly suitable.

It is moreover advantageous if at least some of the films have a wave-like surface. The individual films thereby form wave-like elevated portions having trough-like recesses arranged therebetween. This has the consequence that when wear occurs, with material removal from the surface, regions arise at the surface of the coating which are formed with material of the two film types so that both the advantageous surface properties, such as in improved antifriction behavior, of the films doped with fluorine and the increased wear resistance of the films without fluorine or with very little fluorine can be utilized at any point in time, even if a successive material removal occurs or has occurred as a result of wear.

In this respect, the waviness of the surface of films starting from the substrate surface up to the surface of the coating should be increased.

No hydrogen or only a portion of hydrogen of a maximum of 0.05 at % should be contained in the films. In addition, no further chemical element doping the films except for C and F, as well as optionally a very small portion of S, should be contained, which facilitates the manufacture, on the one hand, and the surface properties improved by the doped fluorine can be utilized better and more simply. The respective fluorine portion can thus be maintained more simply, more reliably and more precisely in particular in the manufacture of the coating using a PVD process, which will be looked at in more detail in the following. Sulfur can be contained as a precursor on the use of a sulfur compound. In this respect, the portion of sulfur is in every case beneath 1 at %, preferably less than 0.5 at %, particularly preferably less than 0.2 at %.

The blade of a cutting tool, in particular of a razor blade or a part of a slide bearing, can be used as a substrate.

A coating in accordance with the invention has a Young's modulus in the range around 100 Pa and a water contact angle of 100° to 120°. Friction values of less than 0.1 can be achieved which are beneath the friction value of pure PTFE.

There is also the possibility of applying an intermediate fil which in particular improves the adhesion and on which the coating with the individual films is then successively formed before the application of the coating on the surface. Cr, Ti, Ta, Nb, W, Zr or Hf can, for example, be used for the intermediate film.

A procedure can be followed in the manufacture such that when a target of pure carbon/graphite is used, films are deposited on a surface of a substrate by means of a PVD process, with the portion of fluorine contained in doped form in films to be formed alternately being varied by varying a supplied volume flow of a fluorine/carbon compound or sulfur/fluorine compound as a precursor.

In this respect, the portion within a respective one film can additionally be varied by the supply of the precursor so that the portion of fluorine does not have to change abruptly from film to film, but rather the portion within films doped with fluorine first increases starting in the film growing direction and can then drop again after reaching a maximum. The supplied volume flow of the precursor can be regulated accordingly.

It is particularly advantageous to form the coating by means of an arc discharge process. The target can be connected as a cathode in this respect. It can be a process in which an electric arc discharge is utilized for plasma formation which is ignited between an anode and the target. The formation can, however, also take place using the so-called laser arc process in which electric arc discharges are likewise used for plasma formation and coating. They are, however, intermittently ignited by means of a laser beam directed at different positions on a target and are quenched again after a specific time before a renewed ignition takes place at another position by means of the laser beam which has been correspondingly deflected. A more uniform material removal usable for the coating can thereby be achieved at the target, whereby an improved utilization of the target material and also a more uniform film formation can be achieved.

An inert gas, in particular argon, having a partial pressure of 0.1 Pa to 0.5 Pa should be supplied during the forming of the coating. In phases in which a precursor is supplied for the fluorine doping, the partial pressure within a vacuum chamber should increase by an amount which is in the range from 0.2 Pa to 1 Pa. It is increased by the precursor then containing fluorine in a gaseous form. If a liquid precursor should be used, it can vaporize within the vacuum chamber and can be recombined into its individual chemical elements so that elemental fluorine and carbon are present which can be utilized for the film formation. The recombination can in this respect take place within the formed plasma.

The supply of a precursor can always take place intermittently when a film of the coating doped with fluorine should be formed. The precursor supply can be blocked in phases in which a film not doped or only a little doped should be formed.

$C_xF_y$, $SF_6$ or $CHF_x$, preferably $CHF_3$, can be used as the precursor, for example.

The supplied volume flow can, for example, increase abruptly after the opening of a valve and can then be maintained at a specific value over a specific time. However, a controlled supply of the precursor can also take place over time in which the volume flow can rise and fall again accordingly.

Inert gas and/or the precursor can be supplied by a porous element, in particular a porous target of carbon. The supplied volume flow within the vacuum chamber and in particular within the formed plasma can thereby be better homogenized, which relates both to the distribution of the volume portions and to the time release. A possibility for supply through a porous target is described in DE 198 50 217 C1. Such a design and the approach described therein can be used in the manufacture of the coating in accordance with the invention.

The substrate provided with a coating in accordance with the invention is corrosion-resistant and can be operated in an aggressive environment. A use under vacuum conditions, that is also in outer space, is also possible. No components or materials impairing the environment, foodstuffs or the physiognomy of living creatures are contained. The coating can easily be brought into skin contact with living creatures, which is in particular advantageous in the use for razor blades.

The invention will be explained in more detail by way of example in the following.

Figure 2:
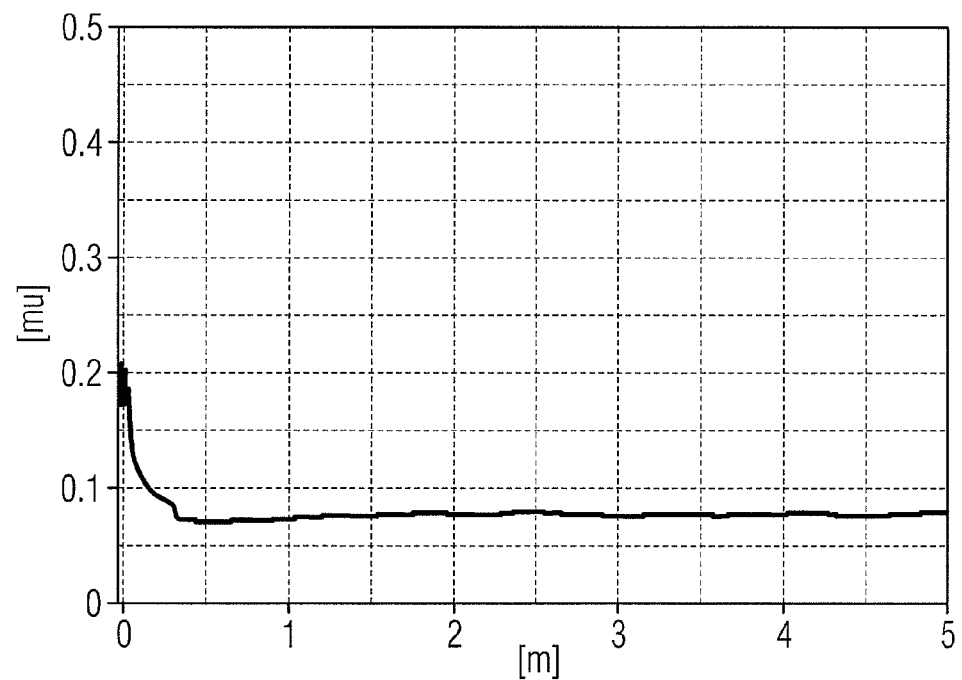

There are shown:

FIG. 1: a microsection of an example of a coating in accordance with the invention having an intermediate film of Cr formed on the substrate surface;

FIG. 2 a diagram of the determined friction coefficient of a coating formed from ten individual films each having a film thickness of 10 nm with contact friction on steel 105CrM17, dry without lubricant, which has been determined using a fretting tribometer over the slide path covered. The portion of fluorine in the ta-C films doped with fluorine was in this respect at 1 at %; the other films were formed solely of ta-C.

Figure 3:
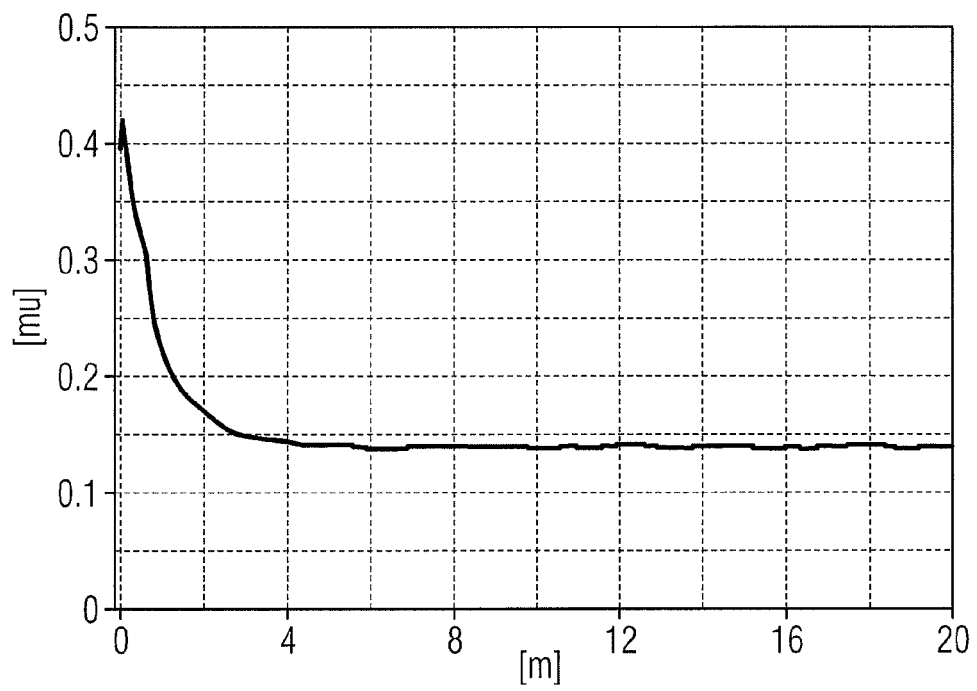
Figure 4:
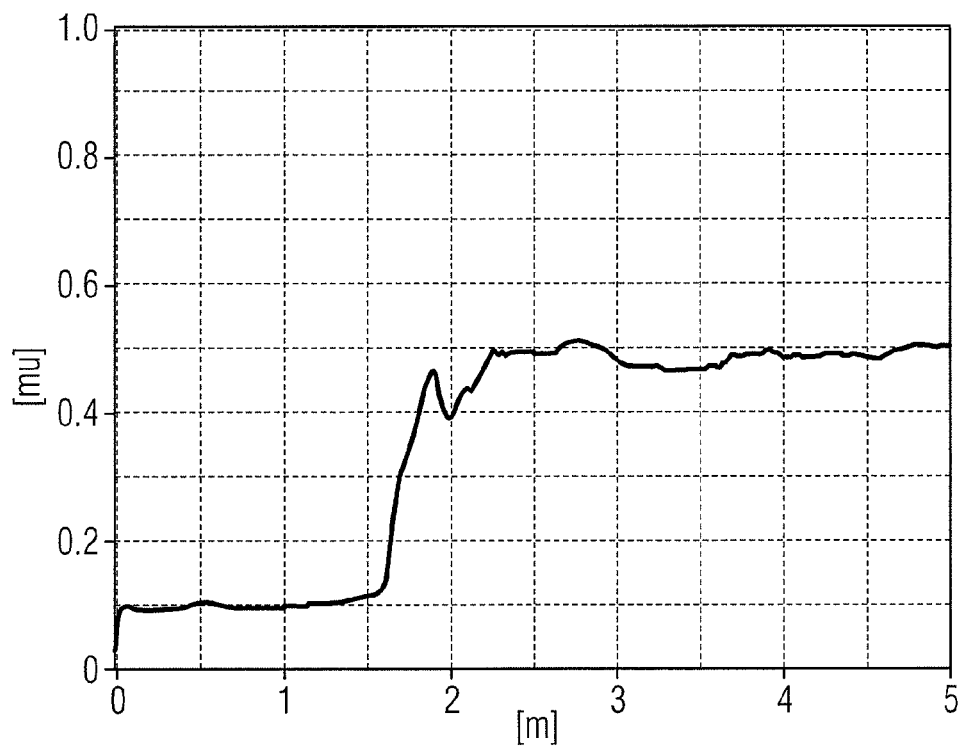

FIG. 3 a comparative diagram with a curve of the friction coefficient which has been determined with a single ta-C film doped with fluorine under the same conditions; and FIG. 4 a comparative diagram with a curve of the friction coefficient determined analogously to FIG. 2, with a surface coated with PTFE being slidingly strained on the steel surface.

It becomes clear by FIG. 1 that a plurality of individual films have been formed over one another on a substrate surface and then on an intermediate film (recognizable as black). In this respect, the lighter regions of the coating are regions with an increased portion of fluorine. It can moreover be recognized that the individual films are formed partly in wave shape and that this is in particular the case with an increasing spacing from the substrate surface, with the waviness of the films also increasing in this direction.

It becomes clear by the diagrams shown in FIGS. 2 to 4 that the friction behavior of a coating in accordance with the invention behaves in a similar manner to a film which is formed from ta-C doped with fluorine. After a brief running-in phase, the friction coefficient falls to an almost constant value which it maintains over a longer time period.

In this respect, the coating in accordance with the invention reached a friction coefficient of 0.075, whereas the friction coefficient of the individual film was at 0.14, that is considerably higher. It unfortunately does not become clear from the diagrams of FIGS. 2 and 3 that the coefficient of friction of a coating in accordance with the invention can be maintained at this low value over a longer period and friction path than was achievable in the one ta-C individual film with fluorine.

It becomes clear from the diagram shown in FIG. 4 that a PTFE coating already shows a substantial increase in the coefficient of friction after a short use, which allows very high wear to be concluded and has the consequence of a very low service life.

The manufacture of an example of a coating in accordance with the invention will now be described in detail in the following for an example.

A substrate of stainless steel is applied perpendicular to the plasma source flat on a substrate holder. The plasma source is formed by a target connected as a cathode which is formed from a cylindrical body of graphite. An anode is arranged at a spacing from the target. Electric arc discharges are ignited in pulsed manner between the target and the anode with an applied electric DC voltage by means of a laser beam which is directed to changing positions of the surface of the target.

The substrate can in this respect be arranged stationary with respect to the target and the anode. There is, however, also the possibility to coat the substrate by means of a rotating movement.

The vacuum chamber in which the coating is carried out is evacuated to a base pressure of $10^{-3}$ Pa and a partial pressure of 0.1 Pa is set using argon in the vacuum chamber.

First, an intermediate film was formed on the substrate surface of chromium or chromium-carbon as an adhesive film by DC sputtering before the coating with the films formed in alternating arrangement is formed on the substrate. This adhesive film has a thickness of a maximum of 15 nm.

The coating with the films formed alternating over one another is then carried out with a supply of 50 sccm-150 sccm argon and the partial argon pressure is maintained in the region of 0.2 Pa-0.6 Pa, whereas the initially described electric arc discharges are ignited and operated between the target and the anode with a constant electric current of 1000 A at a pulse frequency of 500 Hz.

In this respect, an alternating inlet and outlet of 40 sccm-50 sccm $SF_6$ as a rule took place with a partial pressure between 0.5 Pa and 1.0 Pa. In this respect, the inlet and outlet intervals of the $SF_6$ as a precursor can be selected at constant time intervals, e.g. 10 s, or after a predefined number of the electric arc discharges operated in a pulsed manner, e.g. 30,000. With a substrate rotating into and back out of the plasma formed with the electric arc discharges, the number of plasma passages (e.g. 1 rotation) and in this respect also the rotational speed can also influence the thicknesses of the individual films of the coating.

For instance, with a supply of $SF_6$ at a time interval of 100 s with a duration of the supply of 30 s, a film thickness of 3 nm was able to be obtained with a stationary arranged substrate for films in which fluorine was contained. The films in which no fluorine portion or a much lower fluorine portion was contained had a film thickness in this respect of 36 nm.

If the substrate to be coated was moved during the coating and if it was moved at a speed of 1 m/min through the plasma formed by means of the electric arc discharge, a film thickness of 2 nm could be achieved on a supply of $SF_6$ as a precursor on a single movement through the plasma. Fluorine was then contained in such a film. With a substrate likewise moved for the formation of films in which no fluorine portion or a much lower fluorine portion was contained, a film thickness of 8 nm could be achieved with a single movement through the plasma. A substrate can be moved in a rotating manner in this respect.

The invention claimed is:

1. A coating based on diamond-like carbon which is formed on a substrate, wherein the coating is formed from a plurality of films of diamond-like carbon alternating over one another such that a film which contains no portion or only a much lower portion of doped fluorine alternates with a film which contains fluorine or at least a higher portion of fluorine than the film arranged thereunder or thereabove, and wherein all films are formed with ta-C as a diamond-like carbon, and at least some of the films have elevated portions with trough recesses between the elevated portions to define a wave-like surface.

2. A coating in accordance with claim 1, characterized in that fluorine having a portion in the range from 0.5 at % to 5 at % is contained in films comprising fluorine or an increased portion of fluorine.

3. A coating in accordance with claim 1, characterized in that fluorine having a portion 1±0.5 at % is contained in films comprising fluorine or an increased portion of fluorine.

4. A coating in accordance with claim 1, characterized in that films comprising fluorine or comprising an increased portion of fluorine have a smaller film thickness than films in which no portion or only a much lower portion of doped fluorine is contained.

5. A coating in accordance with claim 1, characterized in that all films each have a film thickness in the range 1 nm to 100 nm.

6. A coating in accordance with claim 1, characterized in that the coating is formed with at least two individual films formed over one another.

7. A coating in accordance with claim 1, characterized in that the waviness of the surface of films increases starting from the substrate surface up to the surface of the coating.

8. A coating in accordance with claim 1, characterized in that no hydrogen or only a portion of hydrogen of a maximum of 0.05 at % is contained in the films.

9. A coating in accordance with claim 1, characterized in that no further chemical element doping the films except C and F is contained in the films, with the exception of a very small portion of S.

10. A coating in accordance with claim 1, characterized in that the substrate is the blade of a cutting tool, in particular of a razor blade or a part of a slide bearing.

* * * * *